United States Patent
Maitrejean et al.

(10) Patent No.: US 10,600,786 B2
(45) Date of Patent: Mar. 24, 2020

(54) METHOD FOR FABRICATING A DEVICE WITH A TENSILE-STRAINED NMOS TRANSISTOR AND A UNIAXIAL COMPRESSION STRAINED PMOS TRANSISTOR

(71) Applicants: COMMISSARIAT A L'ENERGIE ATOMIQUE ET AUX ENERGIES ALTERNATIVES, Paris (FR); STMICROELECTRONICS Inc, Coppell, TX (US)

(72) Inventors: Sylvain Maitrejean, Grenoble (FR); Emmanuel Augendre, Montbonnot (FR); Pierre Morin, Grenoble (FR); Shay Reboh, Grenoble (FR)

(73) Assignees: COMMISSARIAT A L'ENERGIE ATOMIQUE ET AUX ENERGIES ALTERNATIVES, Paris (FR); STMICROELECTRONICS Inc, Coppell, TX (US)

( * ) Notice: Subject to any disclaimer, the term of this patent is extended or adjusted under 35 U.S.C. 154(b) by 1 day.

(21) Appl. No.: 15/452,049

(22) Filed: Mar. 7, 2017

(65) Prior Publication Data
US 2017/0263607 A1 Sep. 14, 2017

(30) Foreign Application Priority Data
Mar. 9, 2016 (FR) .................................. 16 51963

(51) Int. Cl.
*H01L 27/092* (2006.01)
*H01L 21/02* (2006.01)
(Continued)

(52) U.S. Cl.
CPC .... *H01L 27/0922* (2013.01); *H01L 21/02532* (2013.01); *H01L 21/02675* (2013.01); *H01L 21/266* (2013.01); *H01L 21/268* (2013.01); *H01L 21/823807* (2013.01); *H01L 29/1054* (2013.01); *H01L 29/66545* (2013.01)

(58) Field of Classification Search
CPC ..... H01L 21/02667–02691; H01L 21/823807; H01L 27/0922; H01L 29/1054
See application file for complete search history.

(56) References Cited

U.S. PATENT DOCUMENTS 6,310,367 B1 * 10/2001 Yagishita ........ H01L 21/26506
257/19
7,335,545 B2   2/2008 Currie
(Continued)

OTHER PUBLICATIONS

French Preliminary Search Report dated Oct. 27, 2016 in French Application 16 51963 filed on Mar. 9, 2016 (with English Translation of Categories of Cited Documents).
(Continued)

*Primary Examiner* — Thao X Le
*Assistant Examiner* — Gardner W. S. Swan
(74) *Attorney, Agent, or Firm* — Oblon, McClelland, Maier & Neustadt, L.L.P.

(57) ABSTRACT

Manufacture of a transistor device with at least one P type transistor with channel structure strained in uniaxial compression strain starting from a silicon layer strained in biaxial tension, by amorphization recrystallization then germanium condensation.

8 Claims, 7 Drawing Sheets

(51) Int. Cl.
*H01L 21/266* (2006.01)
*H01L 21/268* (2006.01)
*H01L 21/8238* (2006.01)
*H01L 29/10* (2006.01)
*H01L 29/66* (2006.01)

(56) References Cited

U.S. PATENT DOCUMENTS

| | | | |
|---|---|---|---|
| 7,531,427 B2* | 5/2009 | Daval | H01L 21/02126 257/E21.207 |
| 2002/0127816 A1* | 9/2002 | Cha | H01L 21/76264 438/404 |
| 2006/0014366 A1 | 1/2006 | Currie | |
| 2006/0286729 A1* | 12/2006 | Kavalieros | H01L 21/28079 438/183 |
| 2007/0010073 A1 | 1/2007 | Chen et al. | |
| 2007/0252205 A1* | 11/2007 | Hoentschel | H01L 21/84 257/347 |
| 2008/0124858 A1 | 5/2008 | Nguyen et al. | |
| 2008/0171426 A1* | 7/2008 | Ren | H01L 21/26506 438/530 |
| 2009/0291540 A1 | 11/2009 | Zhang et al. | |
| 2010/0044748 A1* | 2/2010 | Lin | H01L 27/0262 257/124 |
| 2011/0244674 A1* | 10/2011 | Good | H01L 21/0332 438/591 |
| 2013/0337637 A1 | 12/2013 | Cheng et al. | |
| 2015/0155170 A1 | 6/2015 | Reboh et al. | |

OTHER PUBLICATIONS

S. Baudot et al., "Elastic relaxation in patterned and implanted strained silicon on insulator," Journal of Applied Physics 105, 114302, http://dx.doi.org/1O.1063/1.3137200, 2009, pp. 11.

* cited by examiner

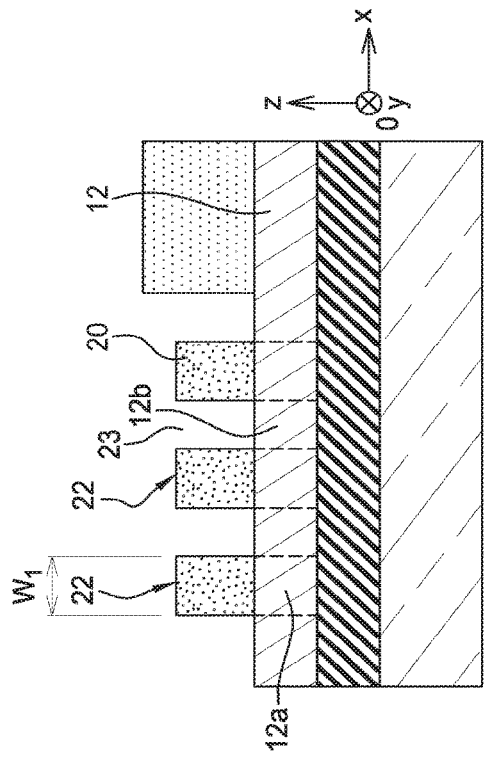
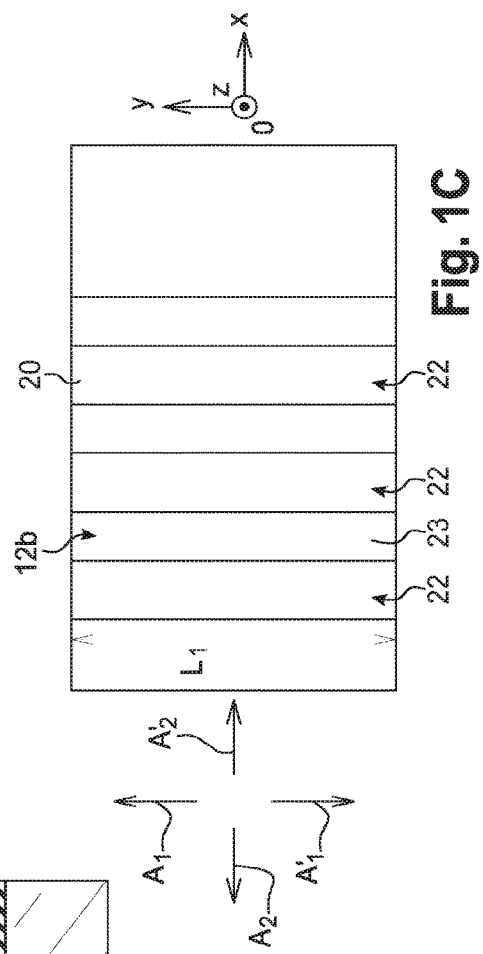
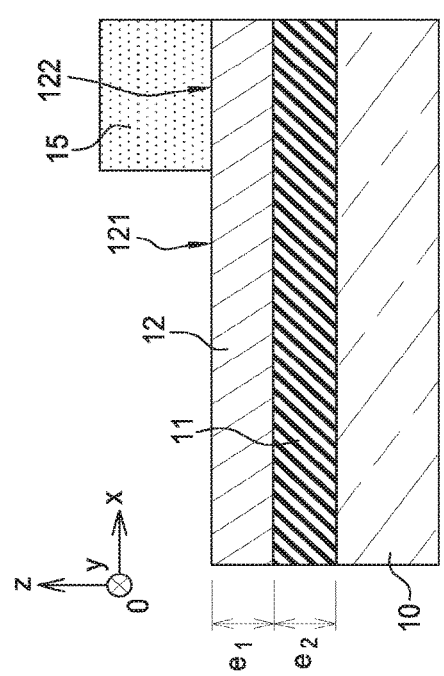
Fig. 1A
Fig. 1B
Fig. 1C

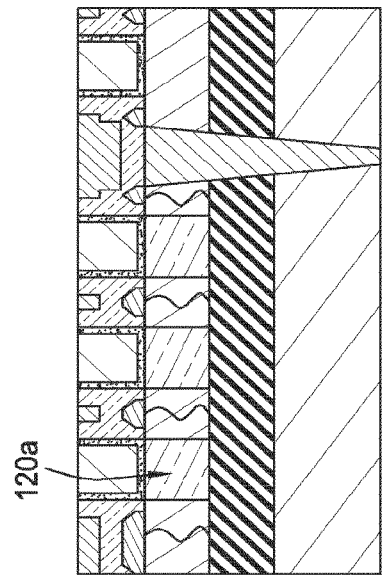
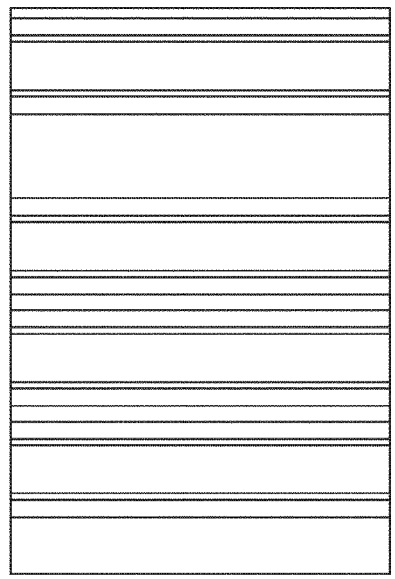
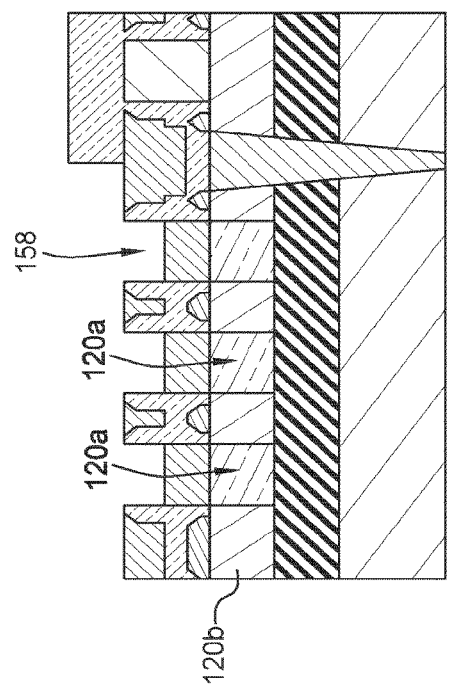
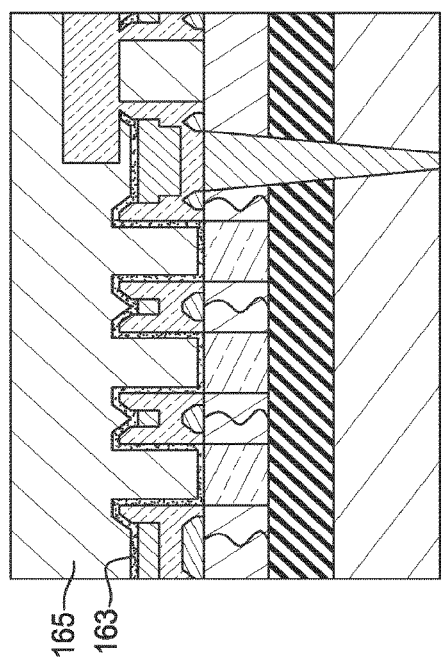

METHOD FOR FABRICATING A DEVICE WITH A TENSILE-STRAINED NMOS TRANSISTOR AND A UNIAXIAL COMPRESSION STRAINED PMOS TRANSISTOR

TECHNICAL FIELD AND PRIOR ART

The present description relates to the field of transistor structures, and particularly those with a channel zone subjected to mechanical strain or stress.

A mechanical strain refers to a material with elongated or shortened crystalline mesh parameter(s).

In the case in which the deformed mesh parameter is larger than the "natural" parameter of a crystalline material, the material is said to be in tensile strain. When the deformed mesh parameter is smaller than the natural mesh parameter, the material is said to be in compressive strain or in compression.

A strain applied to a semiconducting material induces a change to the crystalline mesh and therefore its band structure, which will result in a modification to the mobility of carriers in this material.

The mobility of electrons is increased or reduced by tensile strain or compressive strain respectively in the semiconducting material in which they transit while the mobility of holes is increased or reduced by a compressive strain or tensile strain respectively in the semiconducting material in which they transit.

It is known how to make transistors on a strained semiconducting surface layer of a semiconductor on insulator type substrate.

The strain in this surface layer is usually a biaxial strain.

The performances of a strained channel transistor can be improved by relaxing the strain in a direction orthogonal to the direction in which the channel extends, in other words in a direction orthogonal to the direction in which the current will pass through the transistor.

Such a relaxation can be achieved by etching the side edges of a channel structure made of a strained semiconducting material.

Similarly, it is possible to relax some regions of the strained material to make N type and P type transistors from the same strained semiconducting material.

Document U.S. Pat. No. 7,335,545 B2 discloses a method of relaxing a tensile silicon region, this region then being strained in compression through a silicon nitride liner. The compression strain applied is biaxial.

The question arises of finding a new method of making a transistor device with a strained channel, and particularly different transistors starting from the same strained semiconducting material.

PRESENTATION OF THE INVENTION

One purpose of this invention is to make a strained channel transistor with channel strained in uniaxial compression, and particularly a surface layer comprising a region adapted to making another strained channel transistor with tensile channel.

According to one embodiment, this invention relates to a method of making a transistor device with at least one P type transistor with channel structure strained in compression including the following steps:
form a mask on a first region of a surface layer of a substrate comprising a support layer, an insulating layer separating the support layer from the surface layer, the surface layer being based on a strained semiconducting material and particularly silicon, strained with a biaxial tensile strain, the mask being formed from at least one elongated mask block located on a first zone of the surface layer, the first zone having a length measured parallel to a first direction and a width measured parallel to a second direction, the first zone being capable of accommodating a transistor channel structure, the mask being configured such that one or several elongated openings extending parallel to the first direction are arranged on each side of the mask block and expose second zones of the surface layer on each side of the first zone,
make at least one ion implantation of the surface layer through openings in the mask, so as to make the second zones amorphous,
recrystallise the second zones in the surface layer, and then after removing the mask,
enrich the first zone of the surface layer in germanium,
form at least one gate block of at least one transistor on the first zone of the surface layer, the gate block extending parallel to the second direction.

The gate block is thus located facing the first zone at a location at which the previously removed mask block was previously located.

In particular, the substrate is of the sSOI type.

Thus, by amorphisation through the openings of an elongated mask, the first zone is relaxed in the second direction while maintaining a tensile strain in the first direction.

Then, Ge enriching the first zone makes it possible to create a compression strain in the second direction while in the first direction, the enrichment in germanium makes it possible to form a region that is globally relaxed in the first direction since a tensile strain has been maintained.

Advantageously, during amorphisation of the second zones, recrystallisation of the second zones and the germanium enrichment of the surface layer, a second region of the surface layer dedicated to at least one other transistor is protected by a mask, the other transistor being an N type transistor, the method also comprising the following steps after said germanium enrichment:
remove the mask,
form at least one gate on the second region.

Thus, one or several other N type transistors with an Si channel with tensile strain can be made on the second region of the surface layer.

Several gate blocks can be made at the same time on the first region dedicated to at least one P type transistor and on the second region dedicated to at least one N type transistor, respectively.

A laser heat treatment of the second zones can be made after amorphisation of the second zones of the surface layer and before said recrystallisation of these second zones, so as to improve relaxation of the first zone in the second direction (in other words in the direction in which its width is measured).

According to a first particular embodiment of the method, the elongated mask block may be a sacrificial gate block.

In this case, the method may include the following steps, after amorphisation and then recrystallisation of the second zones:
make a second mask formed of elements located on each side of and adjacent to the mask block,
remove the mask block between said elements of the second mask so as to form at least one cavity exposing the first zone, and then after germanium enrichment of the first zone:

form a replacement gate in said cavity.

In this case, the gate is self-positioned or self-aligned facing the first zone, for which the stress state has been modified by increasing its germanium concentration. One advantage of such an embodiment is that it positions regions in which recrystallisation fronts meet during recrystallisation of the second zones outside the location specified for the channel zone(s). Thus, in the case in which defects are created at the meeting of the fronts, they will be located outside the channel.

Advantageously, after recrystallisation of the second zones and before the second mask is made, source and drain semiconducting regions are grown on each side of the mask block, the second mask then being made so as to cover the semiconducting source and drain regions. Thus, the semiconducting regions are formed before the germanium enrichment and protected from this enrichment step by the second mask.

According to a second particular embodiment of the method, the mask is removed after amorphisation of the second zones and before said germanium enrichment, the germanium enrichment being a germanium enrichment of the first zone and the second zones.

Advantageously, it would be possible that the elongated mask block is made of a material with an intrinsic elastic tensile strain, so as to increase the relaxation effect in the second direction during amorphisation.

The germanium enrichment is advantageously made by a germanium condensation process during which a semiconducting layer based on $Si_{1-x}Ge_x$ is deposited and a thermal oxidation is then done so as to get germanium to migrate from this semiconducting zone into the first zone. The thickness of deposited $Si_{1-x}Ge_x$ and oxidation conditions (duration; temperature) are modulated as a function of the required strain level.

According to another aspect, this invention relates to a transistor device obtained using a method like that defined above.

Thus, one embodiment relates to a transistor device provided with at least one P type transistor with a channel structure strained in uniaxial compression formed in a first region of a surface layer made of tensively strained silicon of an sSOI type substrate, and at least one N type transistor with a channel structure strained in tension in a second region of the surface layer.

BRIEF DESCRIPTION OF THE DRAWINGS

This invention will be better understood after reading the description of example embodiments given purely for information and that are in no way limitative, with reference to the appended drawings on which:

FIGS. 1A-1J illustrate an example of a method of manufacturing a transistor device provided with at least one transistor strained in compression, particularly with a uniaxial strain;

FIGS. 2A-2M illustrate another example of a method of manufacturing a transistor device provided with at least one transistor strained in uniaxial compression with a self-aligned gate.

Figure 1E:
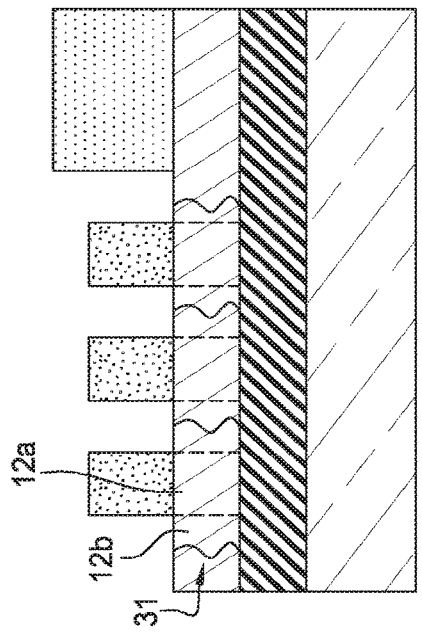

Furthermore, in the following description, terms that depend on the orientation of the structure should be understood assuming that the structure is oriented as shown on the figures.

Identical, similar or equivalent parts of the different figures have the same numeric references to facilitate comparison between the different figures.

The different parts shown on the figures are not necessarily all at the same scale, to make the figures more easily understandable.

DETAILED PRESENTATION OF PARTICULAR EMBODIMENTS

An example method of making a transistor device provided with a strained channel structure will now be described with reference to FIGS. 1A-1J.

The starting material for this method is a strained semiconductor on insulator type material comprising a semiconducting support layer 10, an insulating layer 11 located on and in contact with the support layer 10, itself coated with semiconducting layer 12 called the "surface" layer made of a strained semiconducting material. In particular, an sSOI (strained silicon on insulator) type substrate is used in which the surface semiconducting layer 12 is based on strained silicon with biaxial tensile strain.

If it is required to use transistors based on the FDSOI, ("Fully Depleted Silicon On Insulator") technology, the thickness $e_1$ of the semiconducting surface layer 12 may for example be between 3 and 20 nm, while the thickness $e_2$ of the insulating layer commonly called BOX ("Buried Oxide") based on $SiO_2$ may for example be between 5 nm and 200 nm (the thicknesses $e_1$ and $e_2$ being dimensions measured parallel to a z axis of the orthogonal coordinate system [O; x; y; z] represented on FIG. 1A).

According to one step in the method, a mask 15 is made designed to protect a region 122 of the semiconducting layer 12 in which one or more N type transistors will be formed. The mask can be applied from an SiN layer with a thickness for example of between 40 and 150 nm. A photolithography process is then performed during which one or several alignment marks are used to position the mask 15 precisely facing the region 122 of the surface layer 12 dedicated to N type transistors. The SiN layer is then etched facing another region 121 dedicated to P type transistors, so as to expose this other region 121.

A mask is then formed on the surface layer 12 in this other region 121.

The thickness and composition of the mask are chosen such that the mask is capable of protecting some zones 12a of the region 121 during subsequent implantation steps. The mask is typically a hard mask, for example based on SiN or $SiO_2$. In the example embodiment illustrated on FIGS. 1B and 1C, the mask is formed from several blocks 22 located on the first zones 12a of the surface layer 12, respectively. The first zones 12a are designed to hold transistor channel zones.

Masking blocks 22 can be made using a typical SIT (Sidewall Image Transfer) technique in which spacers are formed in contact with an element that is then removed selectively with regard to the spacers, these spacers then forming mask blocks.

The shapes of the mask blocks 22 are oblong or elongated, and are advantageously parallelepiped shaped. "Elongated" means that their width $W_1$ (measured parallel to the x axis of the [O; x; y; z] coordinate system) is less than their length (that is measured parallel to the y axis of the [O; x; y; z] coordinate system). Typically, the mask blocks 22 can be chosen to have a width $W_1$ for example between 5 nm and 50 nm and a length for example between 100 nm and 10 μm. The mask includes openings 23 exposing second zones 12b of the surface layer 12. The oblongs 23 are also oblong or elongated, for example rectangular, and extend on each side of and along the blocks 22 of the mask 20.

The second zones 12b are designed to hold transistor source and drain zones.

However, it would be possible for the source and drain zones to project slightly into the first zones 12a.

On FIG. 1C, the biaxial tensile strain is applied on the surface semiconducting layer 12 and is shown diagrammatically by arrows A1, A'1 and A2, A'2. It is then required to relax the region dedicated to P type transistors in a given direction of the biaxial strain corresponding to a direction orthogonal to the direction in which the blocks 22 extend (the direction of extension being parallel to the A1-A'1 axis, in other words to the y axis on FIG. 1C).

This is achieved by making an amorphisation of the second zones 12b of the surface layer 12 exposed by the openings 23 in the mask 20. This amorphisation is made using one or several ion implantations, the blocks 22 forming the mask 20 protecting the first zones 12a of the surface layer 12 on which they are supported.

The amorphising implantation (FIG. 1D) can be made for example using Si or Xe atoms at an energy chosen as a function of the nature of the implanted species, the nature and thickness of the surface layer 12, the density of the implantation current and the temperature of the substrate during the implantation.

For example, to make a 15 nm thickness of Si amorphous, Si ions can be implanted at an energy of between 6 keV and 8 keV with a dose of the order of $1 \times 10^{15}$ atoms/cm$^2$. For example, to make a 30 nm thickness of Si amorphous, Si ions can be implanted at an energy of between 14 keV and 25 keV with a dose of the order of $5 \times 10^{14}$ atoms/cm$^2$. According to another example, a 36 nm thickness of Si can also be made amorphous by using Xe at an energy of the order of 60 keV for a dose of between $1E^{14}$ and $3E^{14}$ at/cm$^2$.

Second zones 12b of the surface layer 12 that extend in contact with the first unimplanted zones 12a of the surface layer, and for which the crystalline structure is kept, are thus made amorphous. The second zones 12b can be made amorphous over their entire thickness, in other words until reaching the insulating layer 11 of the substrate.

Amorphisation of the second zones 12b leads to a relaxation of the strain in the first zones 12a in a direction orthogonal to the direction in which the first zones 12a and the second zones 12b extend, this direction also being parallel to the principal plane of the surface layer 12. In this description, the "principal plane" of the surface layer 12 is a plane passing through the surface layer 12 and parallel to an [O; x; y] plane of the orthogonal coordinate system [O; x; y; z]. The direction in which relaxation occurs is parallel to the direction in which the width of the first semiconducting zones 12a is measured. In other words, a relaxation is made in a direction parallel to the x axis of the orthogonal coordinate system [O; x; y; z].

However, a strain is maintained in the first zones 12a in another direction corresponding to the direction in which the first zones 12a extend, in other words a direction parallel to the length $L_1$ of the first semiconducting zones 12a. In other words, a uniaxial strain is maintained in a direction taken parallel to the y axis of the orthogonal coordinate system [O; x; y; z]. The relaxation is thus made without etching the surface layer 12, without creating relief, that can facilitate subsequent manufacturing of a transistor gate.

The mask 20 itself may be made of a material with an intrinsic tensile strain, to enable better relaxation of the first zones 12a in a direction orthogonal to the direction along which they extend. A mask, for example based on tensile SiN, can be used.

A local heat treatment with a laser can also be made locally to further relax the region 121 of the substrate dedicated to P transistors.

For example, an annealing can be made for the silicon zones 12a, 12b for a duration for example of between 5 ns and 250 ns, at a temperature of more than 1150° C. and less than 1400° C., the wavelength of the laser used being typically less than 1 μm.

The second semiconducting zones 12b made amorphous in the surface layer 12 are then recrystallised (FIG. 1E). This is done using the first zones 12a for which the crystalline structure has been kept as starting zones for recrystallisation fronts.

Typically, recrystallisation fronts propagate parallel to the principal plane of the support. Recrystallisation is done by at least one thermal annealing. The duration and temperature of this annealing are adapted as a function of the thickness of the surface layer 12 and the crystallographic orientation of its material. The annealing temperature to recrystallise silicon with a <110> orientation is preferably chosen to be less than 700° C., for example between 500° C. and 700° C.

Recrystallisation can be improved without increasing the annealing temperature by making an implantation of doping species, for example phosphorus or boron, before annealing.

For example, in the case in which zones 12b are oriented in the crystallographic direction (110) and the plane of the substrate is {100}, the thickness of the Si layer may for example be of the order of 36 nm, a 2 minute annealing at 650° C. may be sufficient to recrystallise zones 12b with a width (dimension measured parallel to the x axis) of the order of 20 nm.

The device is shown during manufacturing on FIG. 1E, once the recrystallisation has been done. This figure diagrammatically illustrates the locations 31 at which the recrystallisation fronts meet. These locations 31, that might be likely to contain crystalline defects, are located in the second semiconducting zones 12b that have just been recrystallised and therefore outside zones in which the transistor channel(s) is (are) formed.

Figure 1F:
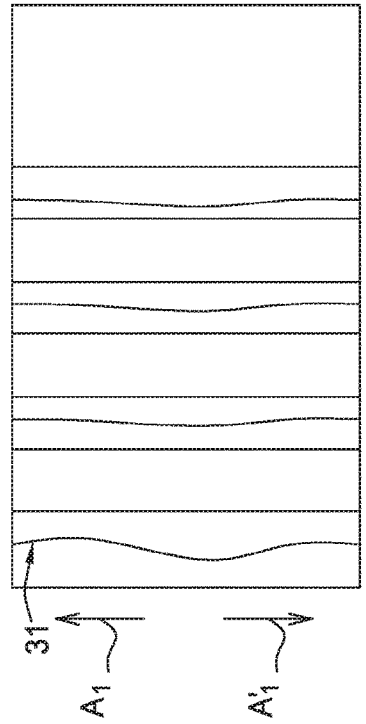
Figure 1D:
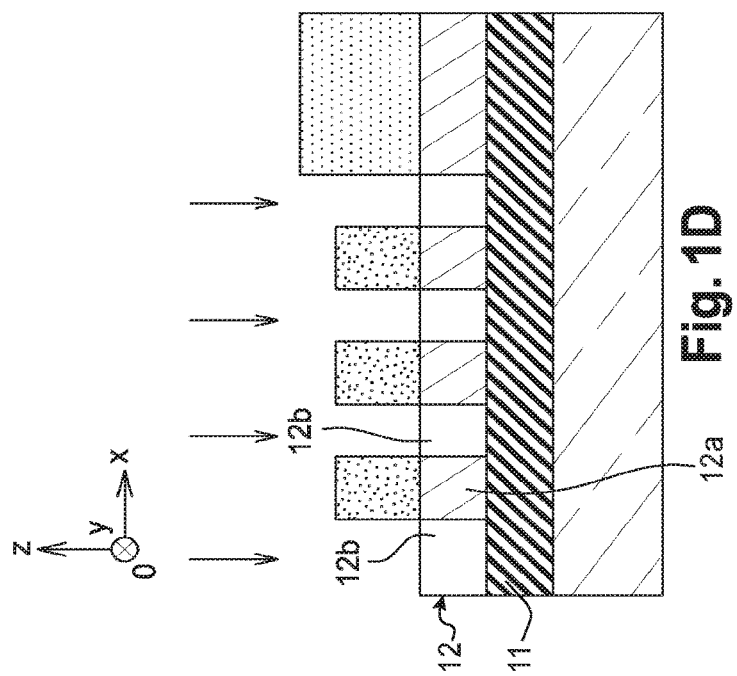

On FIG. 1F, the uniaxial tensile strain is applied on the surface semiconducting layer 12 and is shown diagrammatically by arrows A1, A'1.

The next step is to remove the mask blocks 22, for example by wet etching using a solution based on 85% phosphoric acid heated to below the boiling point for an SiN mask. The first zones 12a of the region 121 dedicated to P type transistor(s) are thus exposed.

The next step is germanium enrichment of the surface semiconducting layer 12, and particularly the region 121 that is not protected by the mask 15. The germanium enrichment of the silicon layer 12 may for example be made using a technique called "germanium condensation" as described for example in the document entitled "Fabrication of strained Si on an ultrathin SiGe on Insulator virtual substrate with a high Ge fraction», Appl. Phys. Lett. 79, 1798, 2001, by Tezuka et al. or in the document entitled "the Ge condensation technique: a solution for planar SOI/GeOI co-integration for advanced CMOS technologies", Materials Science in Semiconductor Processing 11 (2008) 205-213, by Damlencourt et al.

Another possible means of making a germanium enrichment consists of making an SiGe deposit and then doing a diffusion annealing so as to mix Si and Ge. The thickness of the layer to be enriched can then be reduced. As a variant, the thickness of the layer to be enriched can be reduced prior to this enrichment.

Figure 1I:
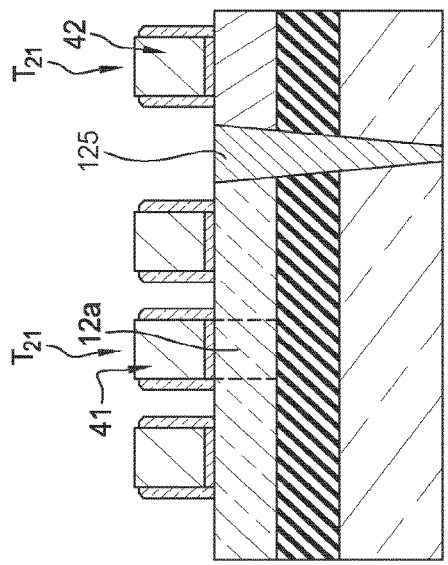
Figure 1J:
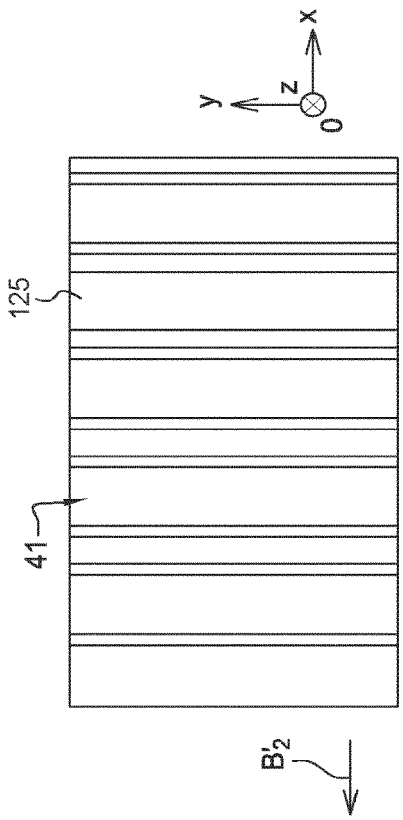
Figure 1G:
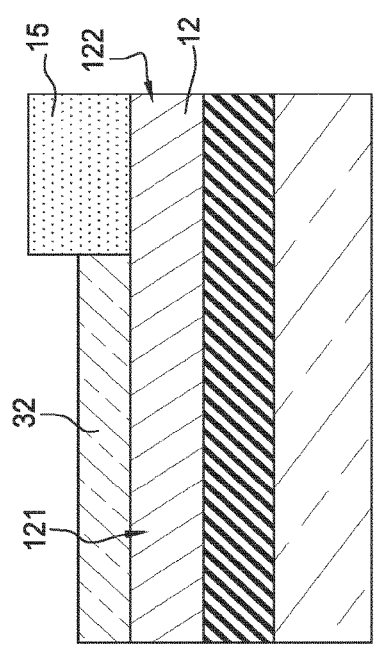

The first step in performing this condensation process is to form an $Si_xGe_{1-x}$ layer 32 on the surface layer 12 and particularly on the region 121 not protected by the mask 15 (FIG. 1G).

A thermal oxidation of the semiconducting layers 12, 32 is then applied to make the germanium migrate in the subjacent silicon layer 12. The thermal oxidation can be done at a temperature for example of between 900° C. and 1100° C., for sufficiently long to reach the required thickness of SiGe, for example between 1 minute and 30 minutes. This oxidation step can be interrupted by diffusion phases with a duration and temperature comparable to those made in a non-oxidising atmosphere to make the distribution of Ge uniform in the subjacent layer. The thickness and composition of the mask 15 are configured so as to prevent oxidation in the region 122 dedicated to N type transistors.

Once oxidation has been done and the germanium migration is complete, the residual oxide layer that formed on the surface layer 12 can be removed, for example by wet etching using a solution based on HF.

The thickness of the deposited $Si_xGe_{1-x}$ layer 32 and the oxidation duration are adjusted as a function of the germanium concentration to be obtained and consequently the strain level to be applied in the region 121 dedicated to P type transistor(s).

Figure 1H:
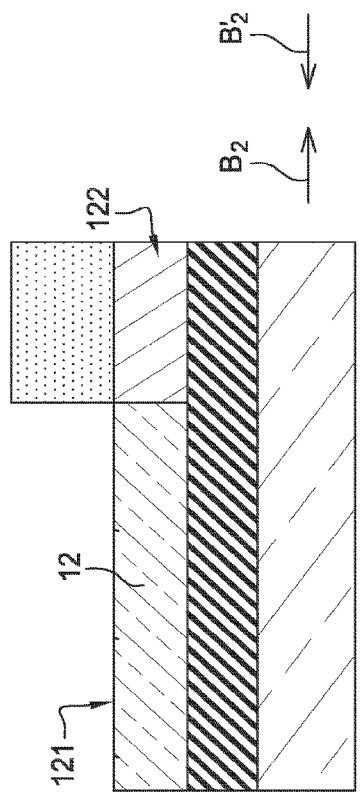

FIG. 1H shows the surface layer 12 with one region 121 based on $Si_{1-y}Ge_y$ (where x>y>0) enriched in germanium and another region 122 made of Si tensile strained that is kept intact. The mask 15 that protected the region 122 dedicated to N type transistor(s) is then removed.

Transistors $T_{11}$, $T_{21}$ are then formed on the region 122 dedicated to N type transistors and on the region 121 dedicated to P type transistors respectively. Making transistors includes particularly the formation of gate electrodes 41, 42 facing regions 121 and 122 respectively. This is done by depositing a gate stack comprising a dielectric and a gate material that are subsequently etched to form gate patterns. The gate dielectric may for example be a high-k material such as $HfO_2$ that is coated for example by a stack based on TiN and a metallic infill material such as W.

The gates 41 made on the region 121 dedicated to P type transistors are located on the first zones 12a and extend parallel to the length $L_1$ of the first semiconducting zones 12a, in other words along a direction parallel to the direction in which the implantation mask blocks extend.

Thus, in the example illustrated on FIGS. 1I and 1J, the gates 41 are oriented along a direction parallel to the y axis of the orthogonal coordinate system [O; x; y; z] and that is orthogonal to the direction of the uniaxial compression stress.

For P type transistors, the compressive uniaxial strain was thus kept in the direction in which the current will flow in these transistors, while having a relaxed strain in the direction orthogonal to the direction in which a current will flow.

The transistor(s) $T_{21}$ of the N type have channel regions made in an unmodified region 122 of the surface semiconducting layer 12 that is in tensile strain.

Thus, a device provided with an N type transistor with a channel in tensile strain and a P type transistor with channel in a uniaxial compressive strain are made starting from the same surface layer 12.

At least one STI type isolation zone 125 can also be made passing through the substrate to isolate the regions 121, 122 dedicated to N type transistors and P type transistors respectively. This is done by making a trench that is filled with dielectric material. Typically, the STI type isolation zone 125 is made before formation of the gates.

According to one variant embodiment of the method that has just been described, different masks can be used to protect the region 122 from the amorphisation implantation and then to protect the same region 122 later from the thermal oxidation necessary to make the germanium condensation.

Thus, in the special case in which the mask 15 used to protect the region 122 from the amorphisation implantation is a polymer mask, this mask can be removed before the recrystallisation annealing.

Another example of the method according to the invention will now be given with reference to FIGS. 2A-2M. This variant can improve the positioning precision of the gates with regard to the first semiconducting zones 12a in which the channel regions are provided.

The first step is to form one or several sacrificial gate blocks 132 on the region 121 dedicated to P type transistors. One or several other sacrificial gate blocks can also be made on the region 122 of the surface layer 12 in this case dedicated to N type transistors. The sacrificial gate blocks may for example be made of polysilicon. In the example embodiment illustrated on FIG. 2A, a mask 145 is arranged on the region 122 dedicated to N type transistors.

Insulating spacers 137, for example based on silicon nitride or a low-k material such as SiOCN can also be formed on each side of the sacrificial gate blocks 132.

Regions not protected by the mask 145 of a dielectric layer are etched to make the spacers 137.

At least one ionic implantation of the zones 120b of the surface layer 12 that are not protected by sacrificial gate blocks 132 is then made, to make these zones 120b amorphous. The sacrificial gate blocks 132 and the spacers located adjacent to these blocks 132 then provide protection for the amorphising implantation.

The mask 145 can be kept during the implantation. In this case it is configured to protect the region 122 dedicated to N type transistors during this implantation.

Figure 2A:
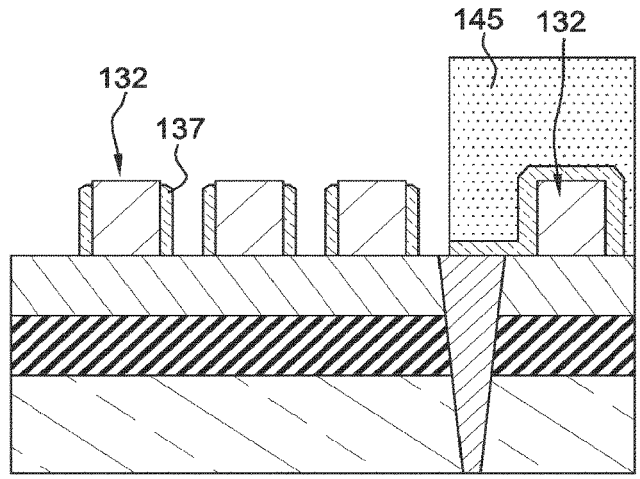
Figure 2B:
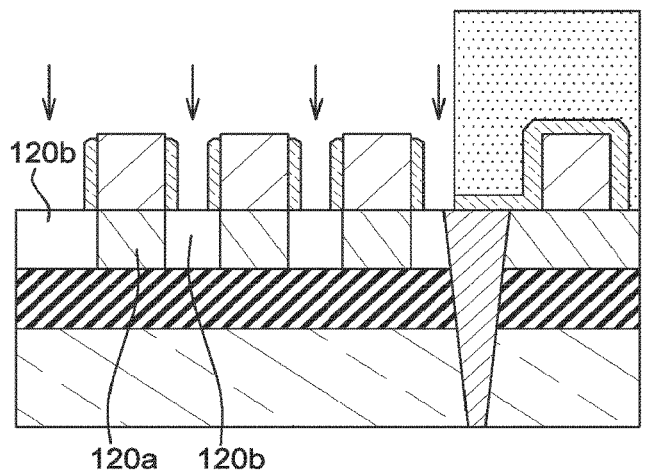
Figure 2C:
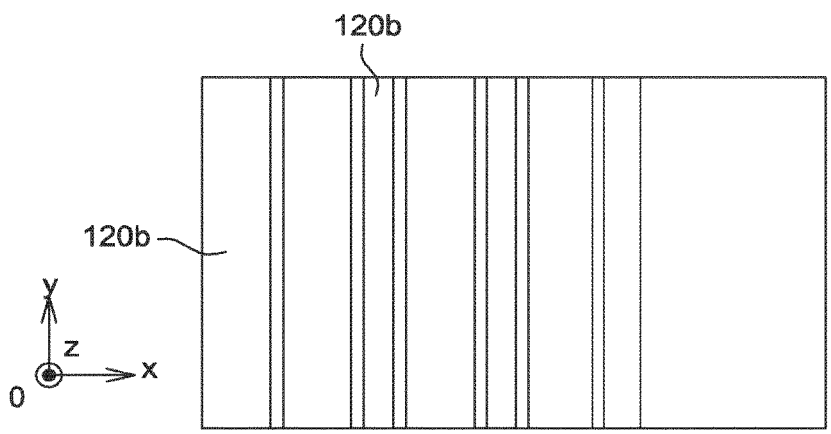
Figure 2D:
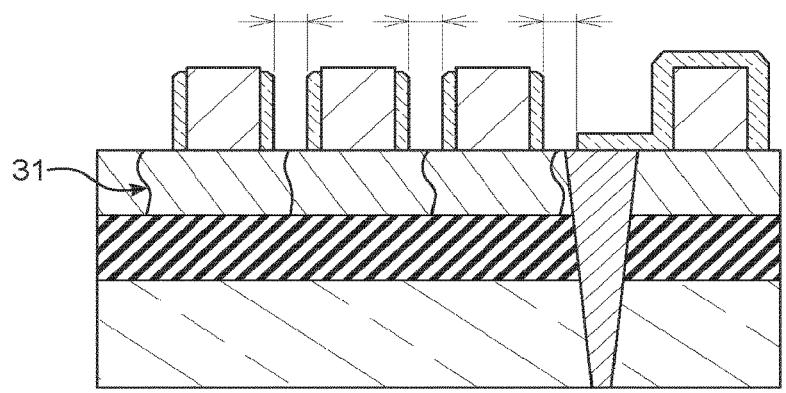
Figure 2E:
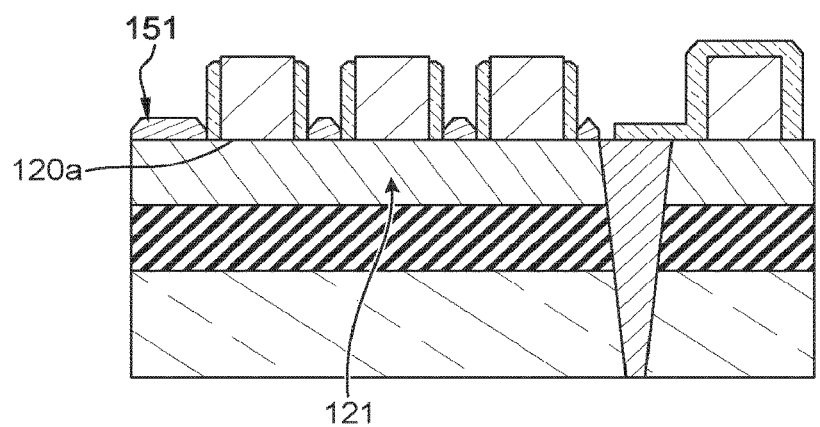
Figure 2F:
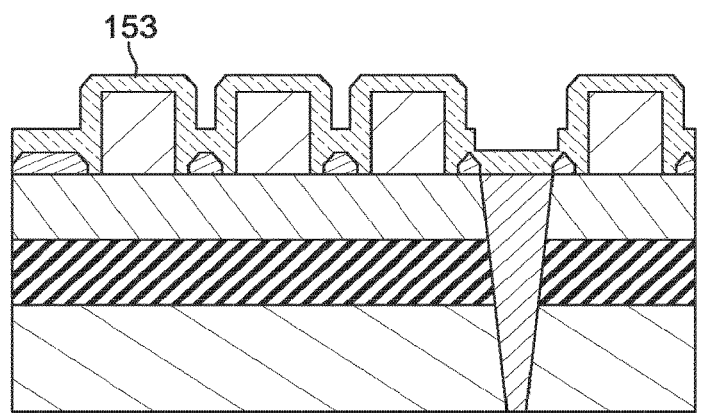

Therefore other zones 120a of the surface layer 12 located under the sacrificial gate blocks 132 are not made amorphous and the crystalline structures are preserved (FIGS. 2B and 2C). Amorphisation can relax these zones in a direction orthogonal to the direction along which the sacrificial blocks 132 extend.

The semiconducting zones 120b are then recrystallised by making one or several thermal annealings. For example, in the case in which the mask 145 is made of resin, this mask is removed before the annealings are made (FIG. 2D on which the locations 31 at which recrystallisation fronts meet are shown diagrammatically).

Once recrystallisation has been done, semiconducting source and drain regions 151 are formed on each side of these sacrificial gates 132. The semiconducting regions 151 are made by epitaxial growth from the surface layer 12. The semiconducting regions 151 are advantageously made based on a material for example such as silicon germanium capable of straining the zones 120a of the region 121 dedicated to P type transistors in compressive strain.

The region 121 dedicated to P type transistors can be protected by a resin layer while the semiconducting source and drain regions in the region 122 dedicated to N transistors are made. Spacers are then formed in the region 122 dedicated to N transistors, Source and drain regions are then formed by epitaxy in the region 122 dedicated to N transistors.

An insulating layer 153 is then formed by conforming deposition so as to cover the semiconducting regions 151, the gate blocks 132 and their associated spacers 137 (FIG.

2F). This insulating layer 153 may be an etch stop layer typically based on silicon nitride.

Figure 2G:
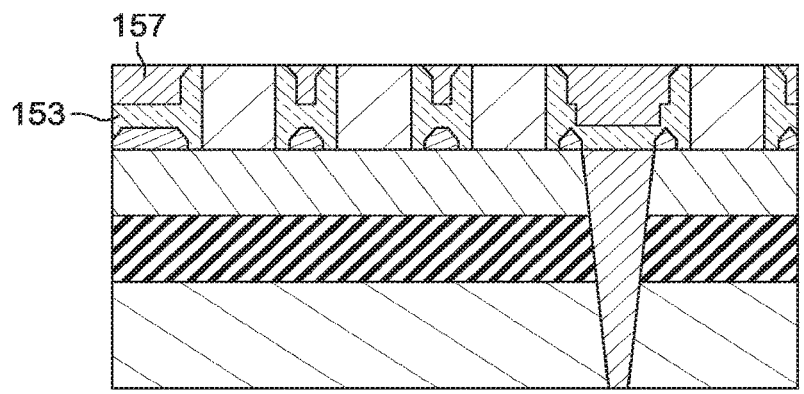

Another insulating layer 157 is then deposited. This other insulating layer 157 may for example be made of silicon nitride and its thickness can preferably be selected so as to fill in the spaces on each side of the gate blocks (FIG. 2G).

Portions 153, 157 of insulating layers projecting from a level above the top faces of the sacrificial gate blocks 132 can then be removed, typically by chemical mechanical polishing (CMP). The stack of insulating layers 153, 157 then forms another mask, the blocks forming this second mask being located on each side of the sacrificial gate blocks 132.

When the top face of the sacrificial gate blocks 132 has been exposed, these sacrificial gate blocks are removed. When the sacrificial gate blocks are made of polysilicon on an $SiO_2$ layer, this removal may for example be done by etching with TMAH at a temperature of between 50° C. and 70° C. for polySi.

Figure 2H:
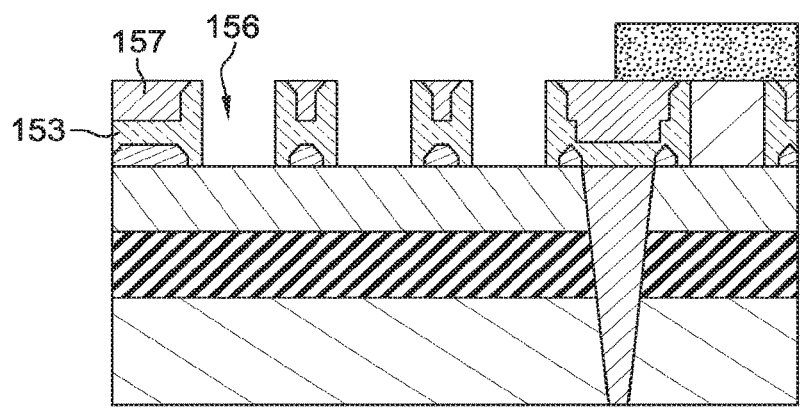

The $SiO_2$ is then removed using a dilute HF solution. Cavities 158 are thus exposed surrounded by blocks of the second mask 155-157 (FIG. 2H).

Figure 2I:
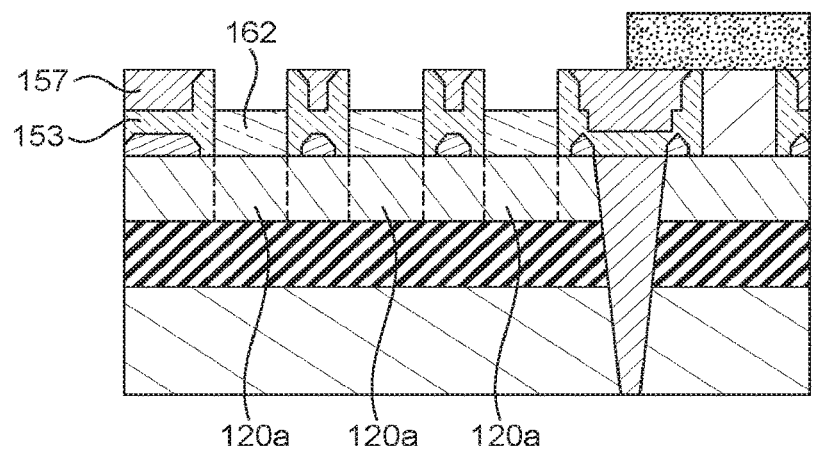

An $Si_xGe_{1-x}$ semiconducting material 162 is then selectively deposited on the surface layer 12 and particularly on zones 120a of the surface layer 12 exposed by the cavities 158 and therefore not protected by the mask 153-157 (FIG. 2I).

A thermal oxidation is then applied so as to enrich the subjacent Si layer 12 and particularly zones 120a, in germanium. The mask 155-157 then acts as an oxidation mask protecting the epitaxied semiconducting zones 151 and the semiconducting zones 120b (FIG. 2J).

The oxidised portions are then removed, for example using an HF based solution, so as to expose the zones 12a enriched in germanium.

When the insulating layer 157 is made of silicon oxide, this layer can be made thick enough so that it is not entirely consumed during the removal of oxidised portions.

A gate dielectric 163, for example of the high-k type such as $HfO_2$, is then deposited in the openings 158, followed by at least one gate material 165, for example formed from a metal coating based on TiN and a metallic infill material such as W. The gate stack thus fills in a region located between the insulating spacers 137 (FIG. 2K).

A step to remove the gate stack is then performed, typically be chemical mechanical polishing (CMP) (FIG. 2L).

The result obtained is replacement gates located precisely facing the zones 120a enriched in germanium. These zones 120a are strained in compression, in this case the compression strain being oriented principally orthogonal to the direction in which the replacement gates extend (FIG. 2M).

The invention claimed is:

1. A method for making a transistor device with at least a P type transistor provided with a transistor channel structure with uniaxial compressive strain, the method comprising:

forming a mask on a first region of a silicon surface layer of a strained silicon-on-insulator (sSOI) type of substrate comprising a support layer, an insulating layer separating the support layer from the surface layer, the surface layer being based on a strained semiconducting silicon material, strained with a biaxial tensile strain, the mask being formed from plural elongated mask blocks located on first zones of the surface layer, the first zones and the mask blocks having a length L1 measured parallel to a first direction and a width W1 measured parallel to a second direction perpendicular to the first direction, the width W1 being such that W1<L1, the mask blocks being sacrificial gate blocks, the first zones accommodating the transistor channel structure, the mask being configured such that elongated openings extending parallel to the first direction are arranged on each side of the mask blocks and expose second zones of the surface layer on each side of the first zones, the elongated openings and the second zones each having a width W2 measured parallel to the second direction and a length L2 measured parallel to the first direction, the width W2 being such that W2<L2;

making at least one ion implantation of the surface layer through the elongated openings in the mask, so as to make the second zones amorphous and to induce a relaxation of the first zones in the second direction while keeping the first zones strained in the first direction;

recrystallising the second zones of the surface layer after making the at least one ion implantation of the surface layer; then making a second mask formed of elements located on each side of and adjacent to the mask blocks; then removing the mask blocks between the elements of the second mask so as to form cavities exposing the first zones; then germanium-enriching the first zones, so as to induce a compressive strain of the first zones in the second direction and to have the first zones relaxed in the first direction; and then forming replacement gate blocks in the cavities on the first zones of the surface layer, the pate blocks extending parallel to the second direction.

2. The method according to claim 1, wherein
during amorphisation of the second zones, recrystallisation of the second zones and the germanium enrichment of the first zones, a second region of the surface layer dedicated to at least one other transistor is protected by a mask, the other transistor being an N type transistor, the method further comprising, after the germanium enrichment:

removing the mask; and
forming at least one gate on the second region.

3. The method according to claim 1, wherein
a laser heat treatment of the second zones is made after amorphisation of the second zones of the surface layer and before the recrystallisation of the second zones.

4. The method according to claim 1, wherein,
after recrystallisation of the second zones and before the second mask is made, semiconducting source and drain regions are grown on each side of the mask blocks, the second mask then being made so as to cover the semiconducting source and drain regions.

5. The method according to claim 1, wherein
the elongated mask blocks are made of a material with an intrinsic elastic strain.

6. The method according to claim 1, wherein
the germanium enrichment is made by a germanium condensation process during which a semiconducting layer based on $Si_{1-x}Ge_x$ is deposited and a thermal oxidation is then performed so as to get germanium to migrate from this semiconducting zone into the first zone.

7. The method according to claim 1, wherein
the at least a P type transistor is based on Fully Depleted Silicon On Insulator (FDSOI) technology.

8. The method according to claim 1, wherein W1 is between 5 nm and 50 nm and L1 is between 100 nm and 10 µm.

* * * * *